(12) United States Patent
Xin et al.

(10) Patent No.: US 12,087,608 B2
(45) Date of Patent: Sep. 10, 2024

(54) TRANSFER APPARATUS AND PROCESSING SYSTEM

(71) Applicants: Beijing E-Town Semiconductor Technology Co., Ltd., Beijing (CN); Mattson Technology, Inc., Fremont, CA (US)

(72) Inventors: Mengyang Xin, Wuhan (CN); Fei Yu, Wuhan (CN); Gonglin Luo, Wuhan (CN)

(73) Assignees: Beijing E-Town Semiconductor Technology Co., Ltd, Beijing (CN); Mattson Technology, Inc., Fremont, CA (US)

(*) Notice: Subject to any disclaimer, the term of this patent is extended or adjusted under 35 U.S.C. 154(b) by 366 days.

(21) Appl. No.: 17/489,226

(22) Filed: Sep. 29, 2021

(65) Prior Publication Data
US 2023/0005772 A1   Jan. 5, 2023

(30) Foreign Application Priority Data

Jun. 30, 2021  (CN) .......................... 202110734999.2

(51) Int. Cl.
| | | |
|---|---|---|
| *H01L 21/677* | (2006.01) | |
| *B25J 19/00* | (2006.01) | |
| *H01L 21/687* | (2006.01) | |
| *B25J 9/04* | (2006.01) | |

(52) U.S. Cl.
CPC ........ *H01L 21/67742* (2013.01); *B25J 19/00* (2013.01); *H01L 21/68707* (2013.01); *B25J 9/043* (2013.01)

(58) Field of Classification Search
CPC ......... H01L 21/67742; H01L 21/68707; H01L 21/67745; H01L 21/67213; H01L 21/67201; H01L 21/67115; H01L 21/265; H01L 21/26593; H01L 21/67167; B25J 19/00; B25J 19/0083; B25J 19/0075; B25J 19/0054; B25J 9/043; B25J 11/0095; B25J 18/04; B25J 18/007
See application file for complete search history.

(56) References Cited

U.S. PATENT DOCUMENTS

| | | | |
|---|---|---|---|
| 9,982,338 B2 | 5/2018 | Chan et al. | |
| 2016/0325440 A1* | 11/2016 | Caveney | ................ B25J 18/04 |
| 2016/0358796 A1* | 12/2016 | Mu | ................ H01L 21/67213 |
| 2020/0161162 A1* | 5/2020 | Yang | ................ H01L 21/67167 |
| 2022/0048182 A1* | 2/2022 | Ono | ........................ B25J 9/043 |

FOREIGN PATENT DOCUMENTS

CN          109585349 A          4/2019

* cited by examiner

*Primary Examiner* — Glenn F Myers
(74) *Attorney, Agent, or Firm* — Dority & Manning, P.A.

(57) ABSTRACT

The present disclosure provides a transfer apparatus and a processing system. The transfer apparatus includes a first transfer assembly configured to transfer a first workpiece to a chamber. The transfer apparatus includes a second transfer assembly configured to transfer a second workpiece from the chamber. The transfer apparatus includes an isolation assembly disposed between the first transfer assembly and the second transfer assembly and configured to isolate energy transfer between the first workpiece and the second workpiece. The transfer apparatus further includes a support assembly configured to restrict the isolation assembly between the first transfer assembly and the second transfer assembly.

20 Claims, 3 Drawing Sheets

TRANSFER APPARATUS AND PROCESSING SYSTEM

PRIORITY CLAIM

The present application claims the benefit of priority of People's Republic of China Patent Application Serial No. 202110734999.2 filed on Jun. 30, 2021, which is incorporated herein by reference.

TECHNICAL FIELD

The present disclosure relates to a field of semiconductor technology, and in particular, to a transfer apparatus and a processing system.

BACKGROUND

In a procedure of fabricating a semiconductor device, various processes may be performed on a wafer in a reaction chamber. The wafer may be transferred to a chamber of a processing system by means of a transfer mechanism for being processed.

SUMMARY

Aspects and advantages of the disclosure will be set forth in part in the following description, or may be obvious from the description, or may be learned through practice of the embodiments. The present disclosure provides a transfer apparatus and a processing system.

In one aspect of the present disclosure, a transfer apparatus is provided. The transfer apparatus includes a first transfer assembly configured to transfer a first workpiece to a chamber. The transfer apparatus includes a second transfer assembly configured to transfer a second workpiece from the chamber. The transfer apparatus includes an isolation assembly disposed between the first transfer assembly and the second transfer assembly and configured to isolate energy transfer between the first workpiece and the second workpiece. The transfer apparatus further includes a support assembly configured to restrict the isolation assembly between the first transfer assembly and the second transfer assembly. A first end of the first transfer assembly is coupled to the support assembly and a second end of the first transfer assembly is configured to reciprocate along the first workpiece transfer direction; and a first end of the second transfer assembly is coupled to the support assembly and a second end of the second transfer assembly is configured to reciprocate along the second workpiece transfer direction.

In another aspect of the present disclosure, a processing system is provided. The processing system includes a chamber configured to process a workpiece. And the processing system further includes a transfer apparatus configured to transfer a first workpiece to the chamber and transfer a second workpiece from the chamber. The transfer apparatus adopts the transfer apparatus according to any one of the embodiments of the present disclosure.

In embodiments of the present disclosure, the energy transfer between the first workpiece on the first transfer assembly and the second workpiece on the second transfer assembly is isolated by means of the isolation assembly, which may prevent or avoid the second workpiece from influencing the first workpiece and is beneficial to the use of repeatable processes to process the workpieces so as to increase the throughput of the workpieces.

These and other features, aspects and advantages of the present disclosure will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure to one of ordinary skill in the art is set forth more particularly in the remainder of the specification, including reference to the accompanying figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In order to increase the transfer efficiency and the processing efficiency, the wafer entering the chamber and leaving the chamber may be transferred simultaneously. Therefore, the wafer leaving the chamber may have an adverse effect on the wafer entering the chamber.

Various embodiments of the present disclosure relate to a transfer apparatus and a processing system including the transfer apparatus, such as a semiconductor processing system or a plasma processing system. In order to achieve rapid transfer, a transfer apparatus such as a transfer chamber may generally include a plurality of transfer assemblies such as a plurality of robot arms, which may transfer a plurality of workpieces such as wafers at the same time. For example, the wafers on the upper robot arms are ready to enter the chamber for being processed, and the wafers on the lower robot arms are ready to return to a wafer boat, after being processed. These wafers may overlap in the vertical projection direction. Therefore, a photoresist on the wafers at the upper robot arms will shrink to some extent by the wafers at the lower robot arms with high temperature, resulting in a relatively high ash (i.e., photoresist removal) rate, which will finally make the ash rate unrepeatable. To overwhelm and minimize the unrepeatable ash rate resulting from the effect of photoresist shrinkage, methods of extending process recipe time and adding pre-season dummy wafers before production wafers are employed. However, such methods have many disadvantages of, for example, too much ash time, low throughput, high cost of tool maintenance, and need of more time to season the chamber.

In the embodiments of the present disclosure, by adding the isolation assembly between the transfer assemblies in the transfer apparatus such as the transfer chamber, for example, by adding an isolation sheet between upper and lower coaxial robot arms, an effect of photoresist shrinkage on the wafer entering the chamber due to high temperature of the wafer leaving the chamber may be effectively eliminated to ensure the repeatability of the ash rate.

Figure 1A:
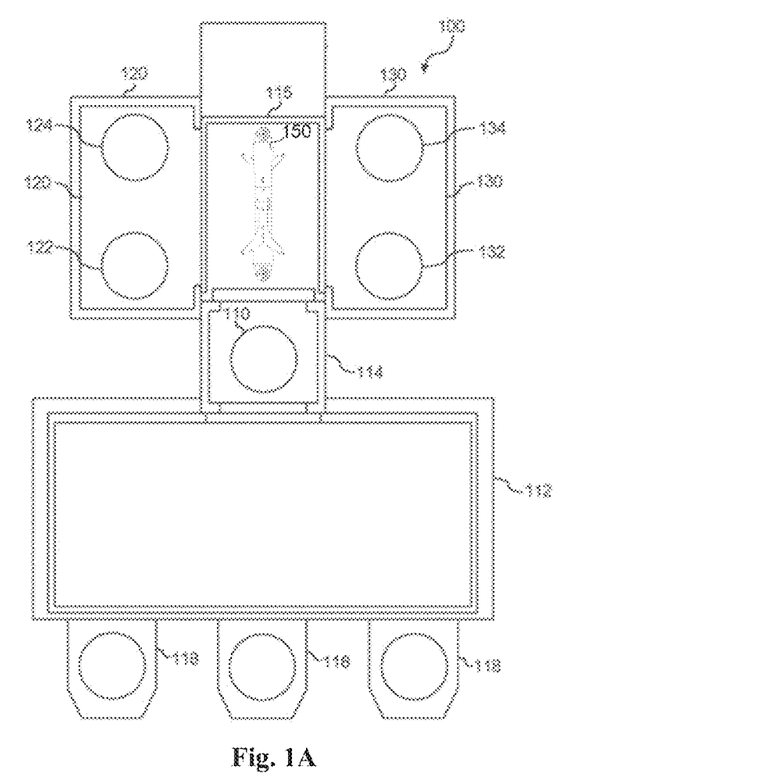
FIG. 1A is a schematic diagram showing a transfer system according to an embodiment of the present disclosure.

FIG. 1A is a schematic diagram showing a processing system 100 according to an embodiment of the present disclosure. The processing system may include a front end portion 112, one or more load and lock chambers 114, a transfer chamber 115 and a plurality of processing chambers including a first processing chamber 120 and a second processing chamber 130. The processing system may include a first workpiece transfer robot 150, which is configured to transfer a workpiece to or from a workpiece column 110, the first processing chamber 120 and the second processing chamber 130 in the load and lock chamber 114 and/or transfer the workpiece between the first processing chamber 120 and the second processing chamber 130.

The front end portion 112 may be configured to be maintained at an atmospheric pressure and may be configured to engage a workpiece feeding apparatus 118. The workpiece feeding apparatus 118 may include for example a cassette, a front opening type wafer transfer box, or other apparatuses for supporting a plurality of workpieces. The workpiece feeding apparatus 118 may be configured to provide a preprocessed workpiece to the processing system 100 or receive a processed workpiece from the processing system 100.

The front end portion 112 may include one or more robots (not shown), which are configured to transfer the workpiece from the workpiece feeding apparatus 118 to, for example, the load and lock chamber 114, for example, to or from the workpiece column 110 in the load and lock chamber 114. In one example, a robot in the front end portion 112 may transfer the preprocessed workpiece to the load and lock chamber 114 and may transfer the processed workpiece from the load and lock chamber 114 to one or more workpiece feeding apparatuses 118. Any robot suitable for transferring the workpiece may be used in the front end portion 112 without departing from the scope of the present disclosure. The workpiece may be transferred to or from the load and lock chamber 114 via a suitable slit, opening, or orifice.

The load and lock chamber 114 may include a workpiece column 110, which is configured to support a plurality of workpieces in a stacked arrangement. The workpiece column 110 may include, for example, a plurality of shelves. Each of the shelves may be configured to support one or more workpieces. In an exemplary embodiment, the workpiece column 110 may include one or more shelves for supporting the preprocessed workpiece and one or more shelves for supporting the processed workpiece.

In some embodiments, appropriate valves may be provided together with the load and lock chamber 114 and other chambers to appropriately adjust the processing pressure for processing the workpiece. In some embodiments, the load and lock chamber 114 and the transfer chamber 115 may be maintained at the same pressure. In such an embodiment, the load and lock chamber 114 does not need to be sealed with respect to the transfer chamber 115. In fact, in some embodiments, the load and lock chamber 114 and the transfer chamber 115 may be part of the same chamber.

A single load and lock chamber 114 is shown in FIG. 1A. By using the disclosure provided herein, those of ordinary skill in the art will understand that a plurality of load and lock chambers 114 may be used in any processing system described herein without departing from the scope of the present disclosure. For example, the system 100 may include a first load and lock chamber for transferring the workpiece into a vacuum portion of the system 100 and a second load and lock chamber for transferring the workpiece from the vacuum portion of the system 100.

The first processing chamber 120 and the second processing chamber 130 may be configured to perform any of a variety of workpiece processes on the workpiece, such as vacuum annealing, surface treatment, dry stripping, dry etching, and deposition, and any other process. In some embodiments, one or more of the first processing chamber 120 and the second processing chamber 130 may include a plasma-based processing source, for example, an inductively coupled plasma (ICP) source, a microwave source, a surface wave plasma source, an ECR plasma source and a capacitively coupled (parallel sheet) plasma source.

As shown in FIG. 1A, each of the first processing chamber 120 and the second processing chamber 130 includes a pair of processing stations arranged side by side, such that a pair of workpieces may be simultaneously exposed to the same process. More specifically, the first processing chamber 120 may include a first processing station 122 and a second processing station 124 arranged side by side.

The second processing chamber 130 may include a first processing station 132 and a second processing station 134 arranged side by side. Each of the processing stations may include a workpiece support (for example, a base), which is configured to support the workpiece during processing. In some embodiments, each of the processing stations may share a common base with two portions configured to support the workpiece. In some embodiments, the workpiece support may include a base assembly, wherein the base assembly includes a substrate, an electrostatic chuck configured to support the workpiece, and a replaceable component. The replaceable component may include a focus ring arranged relative to the electrostatic chuck such that when the workpiece is positioned on the electrostatic chuck, at least a portion of the focus ring at least partially surrounds the periphery of the workpiece. The first processing chamber 120 and/or the second processing chamber 130 may be selectively sealed with respect to the transfer chamber 115 for being processed.

The transfer chamber 115 may include a workpiece transfer robot 150. The workpiece transfer robot 150 may be configured to transfer the workpiece from the workpiece column 110 in the load and lock chamber 114 to the processing station in the first processing chamber 120 and/or the second processing chamber 130. The workpiece transfer robot 150 may transfer the workpiece between the first processing chamber 120 and the second processing chamber 130.

Embodiments of the present disclosure provide a processing system, which may include a chamber configured to process a workpiece; and a transfer apparatus configured to transfer a first workpiece to the chamber and a second workpiece from the chamber. For example, the first workpiece may be a workpiece required to be processed in the chamber, and the second workpiece may be a workpiece that has been processed in the chamber. For example, the first workpiece and the second workpiece may be semiconductor wafers.

The transfer apparatus may include a first transfer assembly, a second transfer assembly and an isolation assembly, wherein the isolation assembly may be disposed between the first transfer assembly and the second transfer assembly to isolate energy transfer between the first workpiece and the second workpiece; and a support assembly, which is configured to restrict the isolation assembly between the first transfer assembly and the second transfer assembly, wherein a first end of the first transfer assembly is coupled to the support assembly, and a second end of the first transfer assembly is configured to reciprocate along the first workpiece transfer direction; and a first end of the second transfer assembly is coupled to the support assembly, and a second end of the second transfer assembly is configured to reciprocate along the second workpiece transfer direction.

For example, a certain semiconductor wafer may be referred to as the first workpiece when being at a state of the semiconductor wafer to be transferred to the chamber on the first transfer assembly. The semiconductor wafer may be referred to as the second workpiece when being at a state of the semiconductor wafer to be transferred from the chamber on the second transfer assembly. In a certain period of time, the second transfer assembly may transfer one or more second workpieces from the chamber while the first transfer assembly transfers one or more first workpieces to the chamber. The influence of energy of the second workpiece on the second transfer assembly on the first workpiece on the first transfer assembly may be eliminated by means of the isolation assembly, which is beneficial to the use of repeatable processes so as to increase the throughput. For the transfer apparatus, reference may be made to the following related descriptions about various embodiments of the transfer apparatus.

In one example, with reference to FIG. 1A, the chamber in the processing system may include the processing chamber of the processing system 100, and the transfer apparatus may include the workpiece transfer robot 150.

Figure 1B:
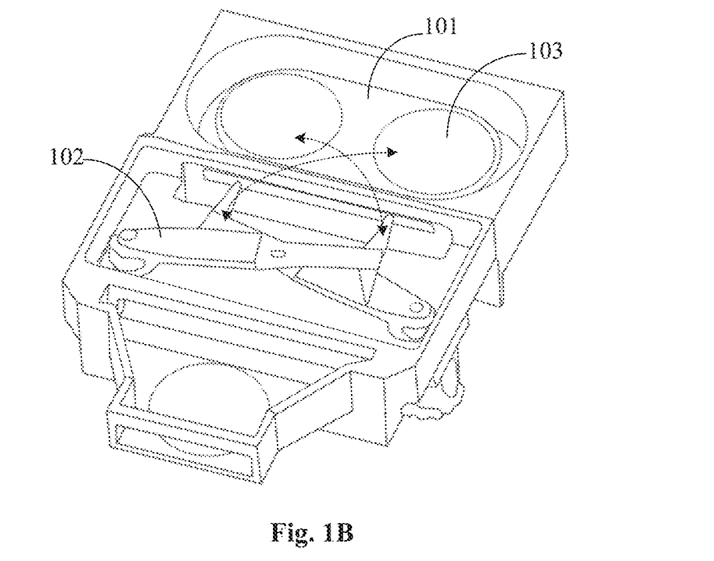
FIG. 1B is a perspective view showing a partial structure of a transfer system according to an embodiment of the present disclosure.

In another example, with reference to FIG. 1B, the processing system may include a chamber 101 and a transfer apparatus 102. The transfer apparatus 102 may transfer the workpiece 103 to the chamber, and may further transfer the workpiece 103 having been processed in the chamber 101 back to a wafer boat.

In one embodiment, the processing system is a semiconductor wafer processing system; and the first workpiece and the second workpiece are semiconductor wafers.

In one embodiment, the semiconductor wafer processing system is a plasma strip.

In one embodiment, the isolation assembly is configured to isolate a high-temperature semiconductor wafer on the second transfer assembly from radiating heat to a low-temperature semiconductor wafer on the first transfer assembly so as to reduce an effect of photoresist shrinkage on the low-temperature semiconductor wafer to enhance repeatability of an ash rate.

Figure 2:
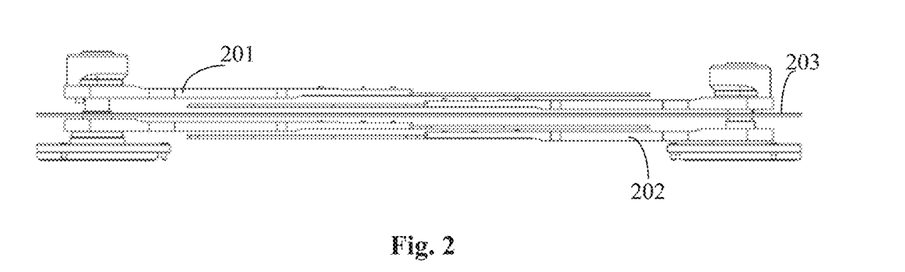
FIG. 2 is a schematic diagram showing a transfer apparatus according to an embodiment of the present disclosure.

FIG. 2 is a schematic diagram showing a transfer apparatus according to an embodiment of the present disclosure. The transfer apparatus may include:

a first transfer assembly 201, which is configured to transfer a first workpiece to a chamber, wherein the first workpiece may be a workpiece required to be processed in the chamber;

a second transfer assembly 202, which is configured to transfer a second workpiece from the chamber, wherein the second workpiece may be a workpiece that has been processed in the chamber;

an isolation assembly 203, which is disposed between the first transfer assembly 201 and the second transfer assembly 202 and configured to isolate the energy transfer between the first workpiece and the second workpiece; and a support assembly 204, which is configured to restrict the isolation assembly 203 between the first transfer assembly 201 and the second transfer assembly 202;

wherein a first end of the first transfer assembly 201 is coupled to the support assembly, and a second end of the first transfer assembly 201 is configured to reciprocate along the first workpiece transfer direction; and a first end of the second transfer assembly 202 is coupled to the support assembly, and a second end of the second transfer assembly 202 is configured to reciprocate along the second workpiece transfer direction.

In the embodiments of the present disclosure, the transfer apparatus is a carrier of the workpiece required to be transferred to or from the chamber. The workpiece may include a semiconductor device such as a wafer and a substrate. Various processes may be performed on the workpiece in the chamber, and the chamber may be referred to as a reaction chamber, a processing chamber, and the like. The chamber of the embodiment of the present disclosure may be a reaction chamber of various types of processing systems. The processing system may perform various processes such as lifting-off, etching and stripping on the workpiece, and may include a semiconductor processing system, a plasma processing system, and the like. For example, the chamber may be a reaction chamber of a plasma strip. In order to accelerate the transfer, the transfer apparatus may include a plurality of transfer assemblies. For example, the transfer apparatus may transfer the first workpiece to be processed to the chamber through the first transfer assembly 201, and may transfer the processed second workpiece from the chamber through the second transfer assembly 202. The transfer apparatus may be referred to as a transfer mechanism, a transfer chamber, and the like. The first workpiece required to be processed may further be referred to as a workpiece entering the chamber, and the processed second workpiece may be referred to as a workpiece leaving the chamber. The isolation assembly 203 may include an isolation sheet with a temperature isolation effect, and the isolation sheet may be made of metal or non-metal.

In one embodiment, the temperature of the second workpiece is higher than that of the first workpiece, and the isolation assembly is configured to isolate the second workpiece from transferring energy to the first workpiece, so as to reduce an effect of photoresist shrinkage on the first workpiece to enhance repeatability of an ash rate.

In one embodiment, the energy includes an infrared radiation, and the infrared radiation has a wavelength in a range of about 1 micron to about 20 microns. In other words, the infrared radiation which may be isolated by the isolation assembly may have a wavelength in a range of 1 micro to about 20 micros. Preferably, the infrared radiation which may be isolated by the isolation assembly may have a wavelength in a range of about 2 microns to about 15 microns.

Further, preferably, the infrared radiation which may be isolated by the isolation assembly has a wavelength in a range of about 5 microns to about 10 microns. In this way, the temperature which may be isolated by the isolation assembly may be in a range of about 90° C. to about 300° C.

In one embodiment, the isolation assembly includes an infrared reflective surface to isolate the infrared radiation.

In one embodiment, the infrared reflective surface of the isolation assembly may face one with higher temperature of the first transfer assembly and the second transfer assembly. For example, if the wafer leaving the chamber is relatively high in temperature, the second transfer assembly is relatively high in temperature, and the infrared reflective surface of the isolation assembly may face the second transfer assembly.

In one embodiment, the isolation assembly includes a cold source to reduce the temperature of the isolation assembly. The type of the cold source may be flexibly selected, for example, according to a spacing between the first transfer assembly and the second transfer assembly, and/or the like.

In one embodiment, the isolation assembly has a thickness in a range of about 2.5 mm to about 3.5 mm. For example, the isolation assembly has a thickness of about 3 mm. The thickness range is only an example and not a limitation, and other thicknesses are possible.

In one embodiment, the isolation assembly is equally spaced from the first transfer assembly and the second transfer assembly in the vertical projection direction. The equal spacing is only an example and not a limitation, and non-equal spacing is possible. For example, the lower surface of the transfer arm at the lowermost layer of the first transfer assembly is coated with an infrared reflective surface. The spacing between the isolation assembly and the first transfer assembly in the vertical projection direction is zero. The spacing between the isolation assembly and the second transfer assembly in the vertical projection direction is equal to the distance between transfer arms of the first transfer assembly and the second transfer assembly in the vertical projection direction. For another example, the spacing between the isolation assembly and the first transfer assembly in the vertical projection direction is smaller than the spacing between the isolation assembly and the second transfer assembly in the vertical projection direction.

In one embodiment, the first transfer assembly and the second transfer assembly have a distance in a range of about 4 mm to about 5 mm in the vertical projection direction. For example, the distance may be 4.4 mm. The distance range is only an example and not a limitation, and other distances are possible.

In one embodiment, the isolation assembly is made of metal.

In one embodiment, the metal is aluminum. The aluminum is only an example and not a limitation, and other metals with good temperature isolation effects are possible.

In one embodiment, the aluminum is 6061-T6 aluminum. The product model of the aluminum is only an example and not a limitation, and other product models with good temperature isolation effects are possible.

In one embodiment, the metal includes an infrared reflective layer.

In one embodiment, the infrared reflective layer faces one with higher temperature of the first transfer assembly and the second transfer assembly.

In one embodiment, the infrared reflective layer faces the second transfer assembly.

For example, if the isolation assembly is an isolation sheet, the first transfer assembly is above the second transfer assembly, and the wafer transferred by the second transfer assembly is relatively high in temperature, the surface of the isolation sheet facing the second transfer assembly may be coated with the infrared reflective layer.

For another example, the first transfer assembly is above the second transfer assembly, and the wafer transferred by the second transfer assembly is relatively high in temperature. The surface, which is adjacent to the second transfer assembly, of the first transfer assembly is coated with an infrared reflective layer. In this case, the isolation assembly may include an infrared reflective layer coated on the lower surface of the first transfer assembly.

In one embodiment, the isolation assembly is made of non-metal.

In one embodiment, the non-metal includes at least one or a combination of polytetrafluoroethylene (PTFE, also known as Teflon), graphite, quartz, ceramic, gas and vacuum. For example, the isolation assembly includes two layers of sheets, and gas is filled between the two layers of sheets. For another example, air between the two layers of sheets included in the isolation assembly is drawn out, such that a vacuum state exists between the two layers of sheets. The non-metals mentioned above are only examples and not a limitation, and other non-metals with good temperature isolation effects may be employed to make the isolation assembly.

In addition, the metal and the non-metal may be combined to form the isolation assembly. For example, the surface of the PTFE is coated with a metal infrared reflective layer.

In addition, in the embodiments of the present disclosure, the material of the isolation assembly may be selected according to some physical parameters related to the temperature. For example, the material of the isolation assembly may be selected according to the thermal conductivity, particularly, for example, the thermal conductivity of the aluminum AL is about 238 W/mK, the thermal conductivity of the PTFE is about 0.256 W/mK, the thermal conductivity of the quartz is about 36 W/mK, and the thermal conductivity of the ceramic is about 29.3 W/mK. If the isolation assembly is made of a synthetic material, the thermal conductivity may change.

In one embodiment, the shape and the size of the isolation assembly may be set according to the size of the transfer assembly. For example, the isolation assembly may be of a rectangle with a length slightly longer than the transfer arm. The width of the isolation assembly may be slightly wider than the widest part of the transfer arm, or may be less than or equal to the widest range of a reciprocating movement of the transfer arm along the workpiece transfer direction.

In one embodiment, the first end of the first transfer assembly is coupled to the support assembly and the first end of the second transfer assembly is coupled to the support assembly through a rotatable coupling.

In one embodiment, reciprocating along the first workpiece transfer direction and reciprocating along the second workpiece transfer direction are axially rotating around a rotation shaft; and the rotatable coupling is the rotatable coupling relative to the rotation shaft.

For example, the support assembly includes a rotation shaft, wherein the first end of the first transfer assembly and the first end of the second transfer assembly are rotatably coupled with respect to the rotation shaft. The first transfer assembly and the second transfer assembly may be controlled to rotate axially around the rotation shaft, such that the second end of the first transfer assembly and the second end of the second transfer assembly reciprocate along the workpiece transfer direction to transfer the workpiece to or from the chamber.

In one embodiment, the first end of the first transfer assembly is coupled to the support assembly and the first end of the second transfer assembly is coupled to the support assembly through a fixed coupling.

For example, the support assembly includes a fixed shaft, wherein the first end of the first transfer assembly and the first end of the second transfer assembly are respectively fixedly connected with the fixed shaft. The fixed shaft may be controlled to drive the first transfer assembly and the second transfer assembly to rotate, such that the second end of the first transfer assembly and the second end of the second transfer assembly reciprocate along the workpiece transfer direction to transfer the workpiece to or from the chamber.

In one embodiment, the support assembly 204 may be coupled with at least one end of the isolation assembly 203. The coupling may be a fixed coupling, a rotatable coupling, and/or the like. For example, the support assembly 204 is fixedly connected with the first end of the isolation assembly 203, and the second end of the isolation assembly 203 rotates with the rotation of the support assembly. For another example, the support assembly 204 is rotatably coupled with two ends of the isolation assembly 203. In the case where the support assembly 204 drives the transfer assembly to rotate, the isolation assembly 203 is unmovable.

In the embodiments of the present disclosure, the connection fashion of the support assembly and the transfer assembly and the connection fashion of the support assembly and the isolation assembly are only an example and not a limitation. In actual application scenarios, other possible implementations are possible. For example, the coupling may be a suspension connection. The support assembly and the isolation assembly are in suspension connection by means of a magnetic force and/or the like, such that there is a certain gap between the support assembly and the isolation assembly, which reduces the frictional force between the support assembly and the isolation assembly and makes the relative rotation between the support assembly and the isolation assembly more smooth.

In an example, the first workpiece entering the chamber on the first transfer assembly 201 is relatively low in temperature, and the second workpiece leaving the chamber on the second transfer assembly 202 is relatively high in temperature after being processed. If no isolation assembly 203 exists between the first transfer assembly 201 and the second transfer assembly 202, since heat may be transferred from an object with high temperature to an object with low temperature, heat of the second workpiece leaving the chamber on the second transfer assembly 202 will be transferred to the first workpiece on the first transfer assembly 201. If an isolation assembly 203 is disposed between the first transfer assembly 201 and the second transfer assembly 202, the heat of the second workpiece on the second transfer assembly 202 may be isolated from being transferred to the first workpiece on the first transfer assembly 201. Certainly, if the second transfer assembly further absorbs heat from the chamber or the workpiece, the isolation assembly 203 may isolate the heat of the second transfer assembly 202 from being transferred to the first workpiece on the first transfer assembly 201. In this way, the second workpiece on the second transfer assembly 202 may be isolated from influencing the first workpiece on the first transfer assembly 201, which is beneficial to the use of repeatable processes to process the workpieces so as to increase the throughput of the workpieces.

For example, the ash rate of the first workpiece transferred to the chamber by the first transfer assembly within the first period of time is V1; and in a case where the isolation assembly is provided, the ash rate of the first workpiece transferred to the chamber by the first transfer assembly within the second period of time is V2, wherein V1 may be equal to V2. Therefore, the ash rate of the workpiece may be repeated by means of the isolation assembly.

For example, if the photoresist on the wafer needs to be removed, the energy transfer between the wafer on the first transfer assembly 201 and the wafer on the second transfer assembly 202 is isolated by means of the isolation assembly 203, and the influence of the energy of the wafer on the second transfer assembly 202 on the photoresist of the wafer on the first transfer assembly 201 may be eliminated to ensure repeatability of the ash rate. In this way, it is beneficial in reducing ash time, increasing throughput, decreasing the cost of tool maintenance and lowering time to season the chamber.

Figure 3:
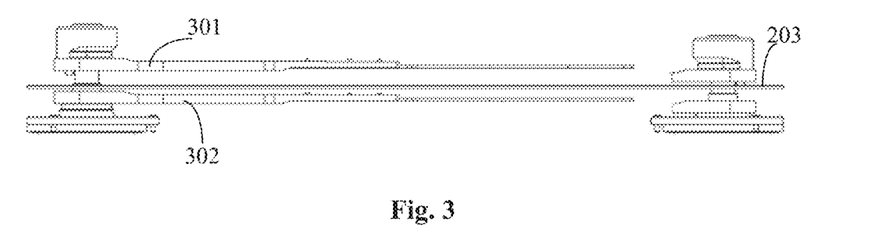
FIG. 3 is a schematic diagram showing a transfer apparatus according to another embodiment of the present disclosure.

FIG. 3 is a schematic diagram showing a transfer apparatus according to another embodiment of the present disclosure. On the basis of the foregoing embodiment, in one embodiment, the isolation assembly 203 is positioned below the first transfer assembly 201 and above the second transfer assembly 202. The isolation assembly 203 may be configured to isolate the second workpiece on the second transfer assembly 202 from transferring heat to the first workpiece on the first transfer assembly 201. For example, the processes of transferring the first workpiece to the chamber by the first transfer assembly 201 of the transfer apparatus and the process of transferring the second workpiece to the chamber by the second transfer assembly 202 may be synchronized or alternated. If the two processes are synchronized, the first transfer assembly 201 may always be positioned above the second transfer assembly 202. If the two processes are alternated, the first transfer assembly 201 may be positioned above the second transfer assembly 202 for a part of the time. In the case where the first transfer assembly 201 is positioned above the second transfer assembly 202, the second workpiece on the second transfer assembly 202 may more easily transfer heat to the first workpiece on the first transfer assembly 201. The isolation assembly 203 may effectively isolate the second workpiece on the second transfer assembly 202 below from transferring heat to the first workpiece on the first transfer assembly 201 above. If the first workpiece on the first transfer assembly 201 has a photoresist, the effect of photoresist shrinkage of the first workpiece on the first transfer assembly 201 may be eliminated to ensure repeatability of the ash rate.

In one embodiment, the first transfer assembly 201 includes at least one transfer arm, and the at least one transfer arm is configured to transfer the first workpiece, that is, the workpiece to be processed, to the chamber.

In one embodiment, the second transfer assembly 202 includes at least one transfer arm, and the at least one transfer arm is configured to transfer a second workpiece, that is, a processed workpiece, from the chamber.

In the embodiments of the present disclosure, the number of the transfer arms included in the first transfer assembly or the second transfer assembly is not limited, and may be set flexibly according to the processing capacity of the chamber.

In one embodiment, with reference to FIG. 3, the first transfer assembly 201 includes a first transfer arm 301, the second transfer assembly 202 includes a second transfer arm 302, and the first transfer arm 301 and the second transfer arm 302 are coaxial vertically; and an end of the first transfer arm and an end of the second transfer arm are respectively connected to a first shaft 401 of the support assembly. For example, one end of the first transfer arm 301 is connected above the first shaft and the other end thereof may rotate around the shaft for a certain angle; and one end of the second transfer arm 302 is connected below the first shaft and the other end thereof may rotate around the shaft for a certain angle. The first transfer arm 301 and the second transfer arm 302 are connected to the same axis, which facilitates synchronous control of the first transfer arm 301 and the second transfer arm 302. The first transfer arm 301 and the second transfer arm 302 are controlled to rotate around the first shaft towards the chamber. The first transfer arm 301 may transfer the first workpiece to the chamber. The second transfer arm 302 will receive the second workpiece leaving the chamber. The first transfer arm 301 and the second transfer arm 302 are controlled to rotate around the first shaft away from the chamber. The first transfer arm 301 may receive a new first workpiece required to be processed, and the second transfer arm 302 will transfer the processed second workpiece leaving the chamber back to the wafer boat.

In one embodiment, the isolation assembly 203 is configured to isolate the second workpiece on the second transfer arm 302 from transferring heat to the first workpiece on the first transfer arm 301. In this case, the first end of the isolation assembly 203 may be connected to the first shaft in which the first transfer arm 301 and the second transfer arm 302 are located, and the second end of the isolation assembly 203 may be suspended or connected to other assemblies, for example, other shafts.

For example, the isolation assembly 203 may effectively isolate the second workpiece on the second transfer arm 302 below from transferring heat to the first workpiece on the first transfer arm 301 above. If the first workpiece on the first transfer arm 301 has a photoresist, the effect of photoresist shrinkage of the first workpiece on the first transfer arm 301 may be eliminated to ensure repeatability of the ash rate.

Figure 4A:
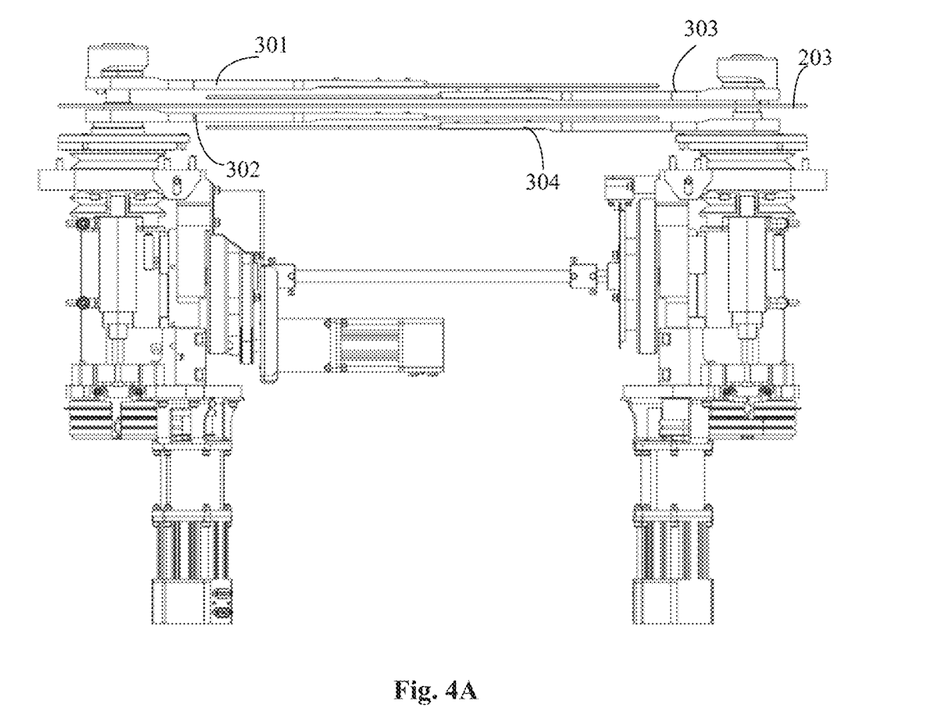
FIG. 4A is a schematic side view showing a transfer apparatus according to another embodiment of the present disclosure.
Figure 4B:
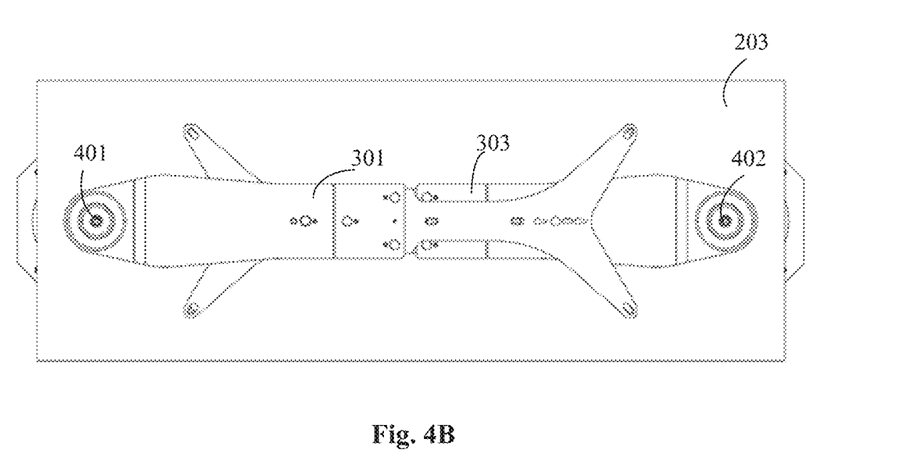
FIG. 4B is a schematic top view showing a transfer apparatus according to another embodiment of the present disclosure.

In one embodiment, with reference to FIG. 4A and FIG. 4B, the first transfer assembly 201 further includes a third transfer arm 303, the second transfer assembly 202 further includes a fourth transfer arm 304, and the third transfer arm 303 and the fourth transfer arm 304 are coaxial vertically; and one end of the third transfer arm 303 and one end of the fourth transfer arm 304 are respectively connected to a second shaft 402 of the support assembly 204. For example, the first transfer assembly 201 includes a first transfer arm 301 and a third transfer arm 303. The second transfer assembly includes a second transfer arm 302 and a fourth transfer arm 304. Among the four transfer arms, the first transfer arm 301 and the second transfer arm 302 are coaxial vertically, and the third transfer arm 303 and the fourth transfer arm 304 are coaxial vertically, which may achieve biaxial crossover and may relatively rapidly transfer the workpiece. In addition, in the horizontal projection direction, the first transfer arm 301 and the third transfer arm 303 may be regarded as symmetrical, and the second transfer arm 302 and the fourth transfer arm 304 may be regarded as symmetrical.

In one embodiment, the isolation assembly 203 is configured to isolate the second workpiece on the second transfer arm 302 and the fourth workpiece on the fourth transfer arm 304 from transferring heat to the first workpiece on the first transfer arm 301 and the third workpiece on the third transfer arm 303. Among them, the first workpiece and the third workpiece are workpieces to be processed, and the second workpiece and the fourth workpiece are processed workpieces. The isolation assembly of this example may isolate the processed workpieces respectively on the second transfer arm 302 and the fourth transfer arm 304 from transferring heat to the processed workpieces respectively on the first transfer arm 301 and the third transfer arm 303.

In this embodiment, although the first transfer assembly and the second transfer assembly respectively include one or two transfer arms as an example for description, in actual application scenarios, more transfer arms may be included. The present disclosure has no limitation on the specific number of the transfer arms. In addition, in this embodiment, the specific number of the workpieces to be processed and the specific number of the processed workpieces are not limited.

In one embodiment, the isolation assembly 203 has a first end and a second end, and the first end of the isolation assembly 203 is connected to the first shaft 401 to which the first transfer arm 301 is connected (that is, the shaft to which the second transfer arm 302 is connected), and the second end of the isolation assembly 203 is connected to the second shaft 402 to which the third transfer arm 303 is connected (that is, the shaft to which the fourth transfer arm 304 is connected).

In one embodiment, the width of the isolation assembly 203 may be greater than the maximum width of each transfer arm, and the length of the isolation assembly 203 may be slightly greater than that of the transfer arm, so as to isolate the heat transfer within a larger range.

In this embodiment, the isolation assembly 203 may effectively isolate the second workpiece on the second transfer arm 302 below and the fourth workpiece on the fourth transfer arm 304 from transferring heat to the first workpiece on the first transfer arm 301 above and the third workpiece on the third transfer arm 303. If the first workpiece on the first transfer arm 301 and the third workpiece on the third transfer arm 303 have a photoresist, the effect of photoresist shrinkage of the first workpiece and the third workpiece may be eliminated to ensure repeatability of the ash rate.

Figure 5:
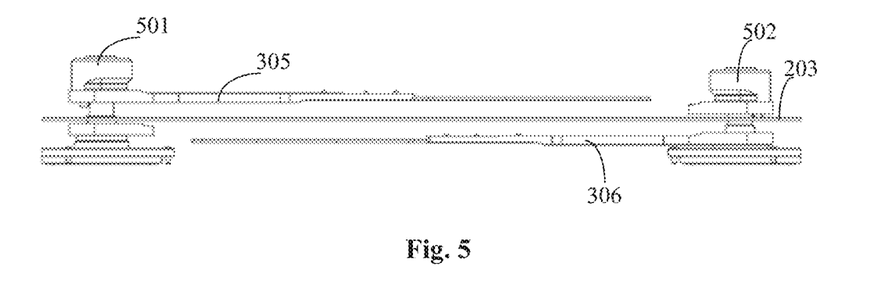
FIG. 5 is a schematic diagram showing a transfer apparatus according to another embodiment of the present disclosure.

FIG. 5 is a schematic diagram showing a transfer apparatus according to another embodiment of the present disclosure. On the basis of the embodiment shown in FIG. 2, in one embodiment, the first transfer assembly 201 includes a first transfer arm 305, the second transfer assembly 202 includes a second transfer arm 306, and the first transfer arm 305 and the second transfer arm 306 are symmetrical. For example, the first transfer arm 305 and the second transfer arm 306 are symmetrical in the horizontal projection direction.

In one embodiment, an end of the first transfer arm 305 is connected to a first shaft 501 of the support assembly 204, and an end of the second transfer arm 306 is connected to a second shaft 502 of the support assembly 204. In other words, one ends of the first transfer arm 305 and the second transfer arm 306 are respectively connected to different shafts of the support assembly.

In one embodiment, the isolation assembly 203 is configured to isolate the second workpiece on the second transfer arm 306 from transferring heat to the first workpiece on the first transfer arm 305.

In one embodiment, the isolation assembly 203 has a first end and a second end, the first end of the isolation assembly is connected to a first shaft 501 to which the first transfer arm 305 is connected, and the second end of the isolation assembly 203 is connected to a second shaft 502 to which the second transfer arm 306 is connected.

In this embodiment, the isolation assembly 203 may effectively isolate the second workpiece on the second transfer arm 306 below from transferring heat to the first workpiece on the first transfer arm 305 above. If the workpiece on the first transfer arm 305 has a photoresist, the effect of photoresist shrinkage of the first workpiece on the first transfer arm 305 may be eliminated to ensure repeatability of the ash rate.

In one embodiment, the isolation assembly 203 is configured to isolate the infrared radiation of the workpiece on the first transfer assembly and the workpiece on the second transfer assembly.

In an application scenario, in order to achieve rapid transfer, the processing system may employ a transfer chamber equipped with, for example, 4 dual-axis crossed robot arms, see the transfer apparatus in FIG. 4A and FIG. 4B. The transfer chamber of the processing system may be an example of the transfer apparatus in the foregoing embodiment, and the four crossed robot arms in the transfer chamber may be an example of the transfer arm in the foregoing embodiment. The rotation shafts at the left side and the right side are connected with the two robot arms, and the workpieces such as wafers entering/leaving corresponding chambers A and B are respectively placed. Generally, the wafer leaving the chamber has high temperature of the process in the chamber, and the wafer entering the chamber is relatively low in temperature.

Such a structure may enable the processing system to transfer 4 wafers at the same time. Among them, the two wafers above are ready to enter the chamber for being processed, and the two wafers below are ready to return to the wafer boat after being processed. At this time, the 4 wafers may overlap in the vertical projection direction. The two wafers above may be affected by the wafers with high temperature below. For example, the photoresist of the wafers above shrinks to a certain extent, resulting in a relatively high ash rate, such that the ash rate is not repeated. Except that the first two wafers entering the chamber is relatively low in ash rate, other wafers are relatively high in ash rate.

By adding the isolation assembly such as the isolation sheet between the lower transfer robot arm and the upper transfer robot arm in the transfer chamber of the processing system, heat transfer such as infrared radiation between the wafers on the upper transfer robot arm and the lower transfer robot arm may be isolated, such that the temperature of the wafer entering the chamber is maintained at the same level, which reduces the effect on the wafer above to ensure repeatability of the ash rate.

In this example, the description is made with the example of the upper transfer robot arm including 2 robot arms and the lower transfer robot arm including 2 robot arms. The isolation sheet may be disposed below the lowermost robot arm of the upper transfer robot arms and above the uppermost robot arm of the lower transfer robot arms. And it is an example that the upper transfer robot arm mentioned above includes 2 robot arms and the lower transfer robot arm includes 2 robot arms and is not a limitation. In actual application scenarios, the number of the upper transfer robot arms and the lower transfer robot arms may vary. For example, there are 4 upper transfer robot arms and 4 lower transfer robot arms. In addition, the number of the upper transfer robot arms and the lower transfer robot arms may be the same or different.

Plasma processing is widely applied in the semiconductor industry for deposition, etching, resist removal and related processes of semiconductor wafers and other substrates. A plasma source (for example, microwave, ECR, induction, and the like) are generally used for plasma processing to generate high-density plasma and reactive substances for processing substrates. In an application scenario, the processing system in the embodiment of the present disclosure may include a plasma strip, such as a 12-inch plasma strip. The plasma strip may be configured to remove the photoresist (i.e., optical resist).

When the workpiece such as the wafer is processed, repeatable ash rates are an important indicator of concern. Since the photoresist (or optical resist) on the wafer is very sensitive to temperature, the photoresist is easily affected by an environment, for instance, a transfer path, temperature, and the like may affect the photoresist.

For example, the processing system includes a plasma strip, and for the transfer apparatus of the plasma strip, reference may be made to FIG. 4A and FIG. 4B. Since the wafer leaving the chamber has high temperature of a stripping process within the chamber, the wafer entering the chamber is relatively low in temperature. The photoresist on the 2 wafers above will shrink to some extent by the wafer with high temperature below, resulting in a relatively high ash rate, such that the ash rate is not repeated (for example, the difference is greater than 4%). By adding the isolation assembly such as the isolation sheet between the lower transfer robot arm and the upper transfer robot arm in the transfer chamber of the plasma strip, the heat transfer between the wafers on the upper transfer robot arm and the lower transfer robot arm may be isolated, such that the temperatures of the wafers entering the chambers are maintained at the same level, the photoresist on the wafer above the upper transfer robot arm is prevented from shrinking, and the effect of photoresist shrinkage is effectively eliminated to ensure repeatability of the ash rate.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged in whole or in part. Furthermore, those of ordinary skill in the art will appreciate that the foregoing description is by way of example only and is not intended to limit the invention so further described in such appended claims.

What is claimed is:

1. A transfer apparatus, comprising:
   a first transfer assembly, configured to transfer a first workpiece to a chamber;
   a second transfer assembly, configured to transfer a second workpiece from the chamber;
   an isolation assembly, disposed below the first transfer assembly and above the second transfer assembly and configured to isolate energy transfer between the first workpiece and the second workpiece; and
   a support assembly, configured to restrict the isolation assembly between the first transfer assembly and the second transfer assembly;
   wherein a first end of the first transfer assembly is coupled to the support assembly and a second end of the first transfer assembly is configured to reciprocate along the first workpiece transfer direction; and a first end of the second transfer assembly is coupled to the support assembly and a second end of the second transfer assembly is configured to reciprocate along the second workpiece transfer direction.

2. The transfer apparatus of claim 1, wherein the second workpiece has a higher temperature than the first workpiece, and the isolation assembly is configured to isolate the second workpiece from transferring energy to the first workpiece so as to reduce an effect of photoresist shrinkage on the first workpiece to enhance repeatability of an ash rate.

3. The transfer apparatus of claim 2, wherein the isolation assembly is positioned below the first transfer assembly and above the second transfer assembly.

4. The transfer apparatus of claim 1, wherein the energy comprises an infrared radiation, and the infrared radiation has a wavelength in a range of about 1 micron to about 20 microns, wherein the isolation assembly comprises an infrared reflective surface to isolate the infrared radiation.

5. The transfer apparatus of claim 1, wherein the isolation assembly comprises a cold source to reduce a temperature of the isolation assembly.

6. The transfer apparatus of claim 1, wherein the isolation assembly has a thickness in a range of about 2.5 mm to about 3.5 mm.

7. The transfer apparatus of claim 1, wherein the isolation assembly is made of metal.

8. A transfer apparatus, comprising:
a first transfer assembly, configured to transfer a first workpiece to a chamber;
a second transfer assembly, configured to transfer a second workpiece from the chamber;
an isolation assembly, disposed below the first transfer assembly and above the second transfer assembly and configured to isolate energy transfer between the first workpiece and the second workpiece, the isolation assembly is made of metal, wherein the metal comprises an infrared reflective layer; and
a support assembly, configured to restrict the isolation assembly between the first transfer assembly and the second transfer assembly;
wherein a first end of the first transfer assembly is coupled to the support assembly and a second end of the first transfer assembly is configured to reciprocate along the first workpiece transfer direction; and a first end of the second transfer assembly is coupled to the support assembly and a second end of the second transfer assembly is configured to reciprocate along the second workpiece transfer direction.

9. The transfer apparatus of claim 1, wherein the isolation assembly is made of non-metal.

10. The transfer apparatus of claim 1, wherein the first transfer assembly comprises at least one transfer arm, and the at least one transfer arm is configured to transfer the first workpiece to the chamber, wherein the second transfer assembly comprises at least one transfer arm, and the at least one transfer arm is configured to transfer the second workpiece from the chamber.

11. The transfer apparatus of claim 1, wherein the first transfer assembly comprises a first transfer arm, the second transfer assembly comprises a second transfer arm, the first transfer arm and the second transfer arm are coaxial vertically, and an end of the first transfer arm and an end of the second transfer arm are respectively connected to a first shaft of the support assembly.

12. The transfer apparatus of claim 11, wherein the first transfer assembly further comprises a third transfer arm, the second transfer assembly further comprises a fourth transfer arm, the third transfer arm and the fourth transfer arm are coaxial vertically, and an end of the third transfer arm and an end of the fourth transfer arm are respectively connected to a second shaft of the support assembly.

13. The transfer apparatus of claim 12, wherein the isolation assembly is configured to isolate the second workpiece on the second transfer arm and a fourth workpiece on the fourth transfer arm from transferring heat to the first workpiece on the first transfer arm and a third workpiece on the third transfer arm.

14. The transfer apparatus of claim 12, wherein the isolation assembly has a first end and a second end, the first end of the isolation assembly is connected to the first shaft to which the first transfer arm is connected, and the second end of the isolation assembly is connected to the second shaft to which the third transfer arm is connected.

15. The transfer apparatus of claim 1, wherein the first transfer assembly comprises a first transfer arm, the second transfer assembly comprises a second transfer arm, the first transfer arm and the second transfer arm are symmetrical, and an end of the first transfer arm is connected to a first shaft of the support assembly and an end of the second transfer arm is connected to a second shaft of the support assembly, wherein the isolation assembly has a first end and a second end, the first end of the isolation assembly is connected to the first shaft to which the first transfer arm is connected, and the second end of the isolation assembly is connected to the second shaft to which the second transfer arm is connected.

16. The transfer apparatus of claim 1, wherein the first end of the first transfer assembly is coupled to the support assembly and the first end of the second transfer assembly is coupled to the support assembly through a rotatable coupling, wherein reciprocating along the first workpiece transfer direction and reciprocating along the second workpiece transfer direction are axially rotating around a rotation shaft; and the rotatable coupling is the rotatable coupling relative to the rotation shaft.

17. The transfer apparatus of claim 1, wherein the first end of the first transfer assembly is coupled to the support assembly and the first end of the second transfer assembly is coupled to the support assembly through a fixed coupling.

18. A processing system, comprising:
a chamber, configured to process a workpiece; and
a transfer apparatus, configured to transfer a first workpiece to the chamber and transfer a second workpiece from the chamber, the transfer apparatus comprising:
a first transfer assembly, configured to transfer a first workpiece to a chamber;
a second transfer assembly, configured to transfer a second workpiece from the chamber;
an isolation assembly, disposed below the first transfer assembly and above the second transfer assembly and configured to isolate energy transfer between the first workpiece and the second workpiece; and
a support assembly, configured to restrict the isolation assembly between the first transfer assembly and the second transfer assembly;
wherein a first end of the first transfer assembly is coupled to the support assembly and a second end of the first transfer assembly is configured to reciprocate along the first workpiece transfer direction; and a first end of the second transfer assembly is coupled to the support assembly and a second end of the second transfer assembly is configured to reciprocate along the second workpiece transfer direction.

19. The processing system of claim 18, wherein the isolation assembly is configured to isolate a high-temperature semiconductor wafer on the second transfer assembly from radiating heat to a low-temperature semiconductor wafer on the first transfer assembly so as to reduce an effect of photoresist shrinkage on the low-temperature semiconductor wafer to enhance repeatability of an ash rate.

20. The transfer apparatus of claim 8, wherein the infrared reflective layer faces the second transfer assembly.

* * * * *